(12) United States Patent
Chen et al.

(10) Patent No.: US 11,740,275 B2
(45) Date of Patent: Aug. 29, 2023

(54) METHOD FOR INTELLIGENT FAULT DETECTION AND LOCATION OF POWER DISTRIBUTION NETWORK

(71) Applicant: Hunan University of Science and Technology, Xiangtan (CN)

(72) Inventors: Chaoyang Chen, Xiangtan (CN); Yong Xiao, Xiangtan (CN); Ming Chi, Xiangtan (CN); Li Ding, Xiangtan (CN); Yanwu Wang, Xiangtan (CN); Zuguo Chen, Xiangtan (CN); Pei Li, Xiangtan (CN); Juan Chen, Xiangtan (CN); Bowen Zhou, Xiangtan (CN)

(73) Assignee: HUNAN UNIVERSITY OF SCIENCE AND TECHNOLOGY, Xiangtan (CN)

(*) Notice: Subject to any disclaimer, the term of this patent is extended or adjusted under 35 U.S.C. 154(b) by 0 days.

(21) Appl. No.: 17/476,917

(22) Filed: Sep. 16, 2021

(65) Prior Publication Data

US 2023/0083078 A1  Mar. 16, 2023

(51) Int. Cl.
*G01R 31/08* (2020.01)
*H02J 13/00* (2006.01)

(52) U.S. Cl.
CPC ...... *G01R 31/086* (2013.01); *H02J 13/00002* (2020.01); *H02J 2203/20* (2020.01); *Y04S 10/52* (2013.01)

(58) Field of Classification Search
USPC .......................................................... 702/59
See application file for complete search history.

(56) References Cited

U.S. PATENT DOCUMENTS

| | | | | |
|---|---|---|---|---|
| 2016/0124452 A1* | 5/2016 | Xu | ..................... | H02J 13/00034 700/297 |
| 2019/0331727 A1* | 10/2019 | Benoit | ................. | G01R 31/086 |
| 2020/0326363 A1* | 10/2020 | Sun | ....................... | H02H 1/0092 |
| 2021/0325441 A1* | 10/2021 | Léonard | ............... | G01R 31/088 |
| 2022/0268827 A1* | 8/2022 | Sun | ....................... | G01R 31/088 |

* cited by examiner

*Primary Examiner* — Paul D Lee
(74) *Attorney, Agent, or Firm* — WPAT, P.C

(57) ABSTRACT

A method for intelligent fault detection and location of a power distribution network is provided, which includes: constructing a network topology of the power distribution network, updating the network topology in real time to obtain an updated network topology, performing a fault identification based on the updated network topology, performing a fault locating based on the updated network topology to determine a fault node, and identifying a fault type based on a fault recorded signal of the fault node. With this method, fault locations and fault types of the power distribution network can be accurately detected in real time.

5 Claims, 1 Drawing Sheet

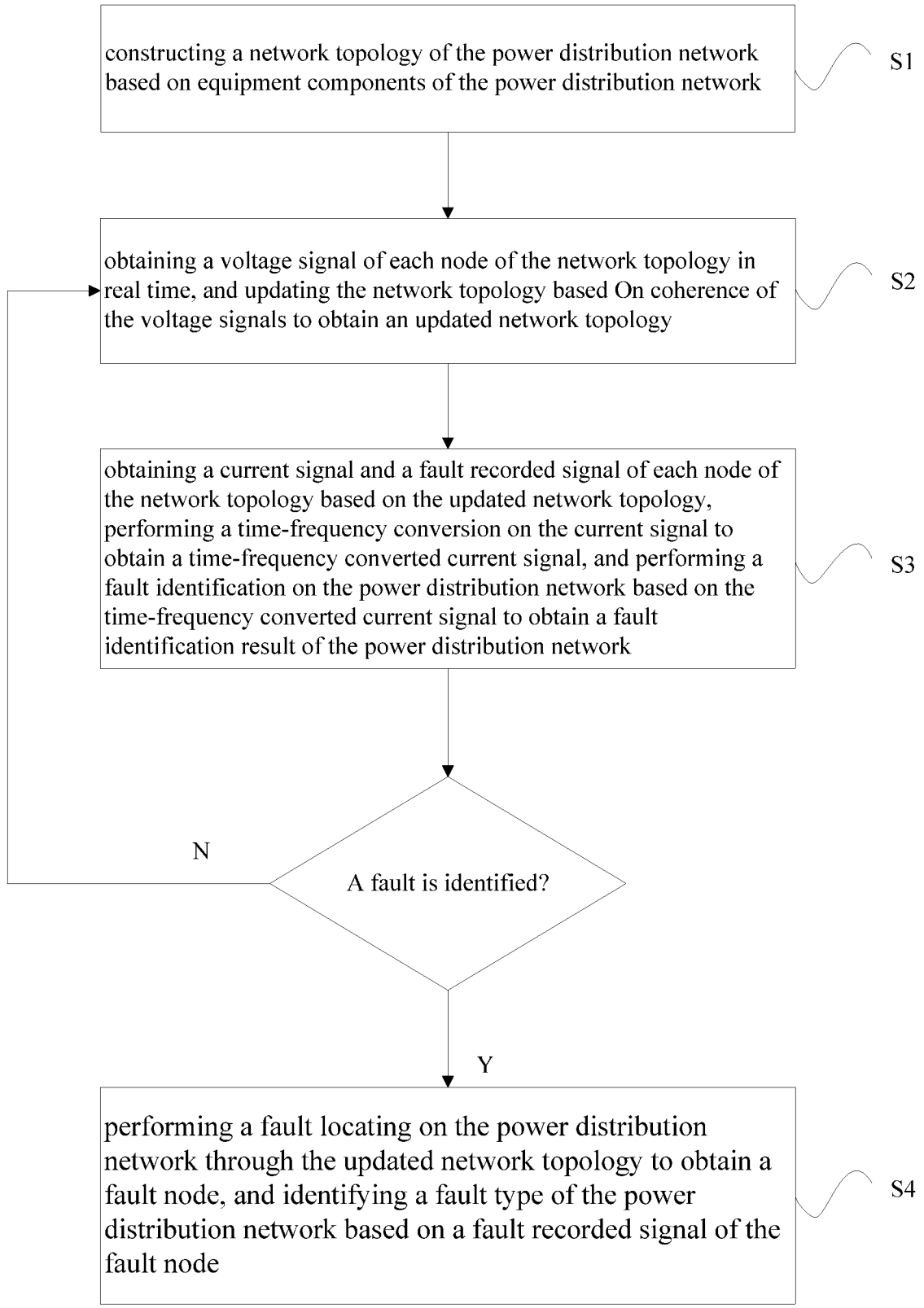

METHOD FOR INTELLIGENT FAULT DETECTION AND LOCATION OF POWER DISTRIBUTION NETWORK

TECHNICAL FIELD

The disclosure relates to the technical field of fault detection for a power distribution network, and particularly to a method for intelligent fault detection and location of a power distribution network.

DESCRIPTION OF RELATED ART

With the rapid development of the national economy and the continuous improvement of people's living standards, people's dependence on power supply is deepening, and their demands for power is increasing. The construction of a power distribution network is becoming more and more mature, a structure of the power distribution network becomes more and more complex, and the requirement for the reliability of the power supply becomes higher. However, due to human operation errors, natural disasters and other factors, an accident or anomaly often occur in a power system. A serious fault will lead to the disconnection of an entire power network, and thus lead to large-scale power outages, thereby bringing great losses to people's lives. When a failure occurs to the power system, an operation and maintenance personnel need to accurately judge a cause of the failure in a short time, enable the power supply of the power system is restored as soon as possible, and ensure the safety of people, a power grid and corresponding equipment. A traditional fault detection method for the distribution network circuit is mainly based on changes of a voltage and a current, however, it leads a heavy workload and a low accuracy. Further, the traditional fault detection method for the distribution network circuit can no longer meet requirements of real-time and accurate detection of distribution network faults, since the power grid is in a stage of rapid development. Therefore, it is particularly required to provide a method for intelligent fault detection and location of a power distribution network.

SUMMARY

An objective of the disclosure is to provide a method for intelligent fault detection and location of a power distribution network, for solving problems in the related art and accurately detecting a fault location and a fault type of the power distribution network in real time.

In order to achieve the above objective, the disclosure provides a method for intelligent fault detection and location of a power distribution network, which includes following steps:

step S1, constructing a network topology of the power distribution network based on equipment components of the power distribution network;

step S2, obtaining a voltage signal of each node of the network topology in real time, and updating the network topology based on coherence of the voltage signals to obtain an updated network topology;

step S3, obtaining a current signal and a fault recorded signal of each node of the network topology based on the updated network topology, performing a time-frequency conversion on the current signal to obtain a time-frequency converted current signal, performing a fault identification on the power distribution network based on the time-frequency converted current signal to obtain a fault identification result of the power distribution network; and repeating steps S2 and S3 in a situation that the fault identification result is that no fault is identified, or implementing step S4 in a situation that the fault identification result is that a fault is identified; and step S4, performing a fault locating on the power distribution network through the updated network topology to determine a fault node, and identifying a fault type of the power distribution network based on a fault recorded signal of the fault node.

In an embodiment, the network topology may be a tree network topology, and a step of constructing the tree network topology of the power distribution network may include:

obtaining a component model of each of the equipment components of the power distribution network; and constructing the tree network topology of the power distribution network based on the component model.

In an embodiment, the component model may be as follows:

Element={ID,Attribute,Relation} where ID indicates an identifier of an equipment component; Attribute indicates a management attribute of the equipment component; and Relation indicates a network attribute of the equipment component.

In an embodiment, constructing the tree network topology of the power distribution network based on the component model may include:

constructing an association matrix R based on the ID and the Relation of the component model, wherein the association matrix R is as follows:

$$R=(E_1,E_2,\ldots,E_N)^T$$

where N indicates the number of the equipment components of the power distribution network; $E_N$ indicates an association vector of the N-th equipment component of the equipment components, and $E_j$ is as follows, wherein $j \in [1, N]$, $$E_j=(ID_j,Relation_j), Relation_j=(ID_{j1},ID_{j2}),$$

where $ID_j$ indicates an identifier and a network attribute of the j-th equipment component of the equipment components; $Relation_j$ indicates an ID of each equipment component associated with the j-th equipment component; $ID_{j1}$ and $ID_{j2}$ respectively indicate IDs of first and second equipment components associated with the j-th equipment component; and the association matrix R is the tree network topology of the power distribution network.

In an embodiment, updating the network topology may include:

obtaining a voltage signal sequence of each node of the network topology during a preset time period;

calculating a Pearson correlation coefficient of the voltage signal sequences of every two adjacent nodes of the network topology based on the tree network topology; and updating the network topology of the power distribution network based on the Pearson correlation coefficient.

In an embodiment, obtaining the voltage signal sequence of each node of the network topology during the preset time period may include:

segmenting the voltage signal obtained in real time based on an extreme point of the voltage signal of each node of the network topology, to obtain the voltage signal sequence of each node during the preset time period.

In an embodiment, a Fourier transform is adopted to perform the time-frequency conversion on the current signal.

In an embodiment, performing the fault identification on the power distribution network may include:

constructing a fault identification model through a deep belief network;

performing a parameter optimization on the fault identification model, to obtain a parameter-optimized fault identification model; and inputting the time-frequency converted current signal into the parameter-optimized fault identification model, to obtain the fault identification result of the power distribution network.

In an embodiment, performing the fault locating on the power distribution network may include: performing the fault locating based on the ID of the equipment component of the network topology.

In an embodiment, identifying the fault type of the power distribution network based on the fault recorded signal of the fault node may include:

constructing a fault type identification model based on a hierarchical support vector machine (H-SVM);

performing a training on the fault type identification model, to obtain a trained fault type identification model; and inputting the fault recorded signal into the trained fault type identification model, to obtain a fault type identification result of the power distribution network.

The disclosure may have the following technical effects.

(1) In the disclosure, the network topology of the power distribution network is constructed based on the component model of each of equipment components of the power distribution network, and the network topology can accurately and effectively reflect identifiers, management attributes and network association attributes of the equipment components of the power distribution network, and the fault of the power distribution network can be quickly and accurately located base on the identifiers of the equipment components.

(2) In the disclosure, the network topology is updated in real time based on the coherence of the voltage signals of the nodes of the power distribution network, so as to realize the real-time and accurate detection of the change-over operations of the switches of the power distribution network. Further, a fault detection is performed based on the updated network topology, and thus the effectiveness of a fault detection result is improved.

(3) In the disclosure, the time-frequency conversion is performed on the current signal in the process of the fault detection, which can effectively avoid the interference of a noise signal to the fault detection result, and the fault detection is performed through the deep belief network, thereby further improving the accuracy of the fault detection.

(4) In the disclosure, the fault recorded signals of all nodes are acquired synchronously in the process of the fault detection, and the fault recorded signals are automatically identified by the H-SVM, therefore, the fault type of the power distribution network can be quickly and accurately acquired.

BRIEF DESCRIPTION OF THE DRAWING

In order to explain embodiments of the disclosure or technical solutions in the related art more clearly, an accompanying drawing referred in the embodiments will be briefly introduced hereinafter. It is apparent that the accompanying drawing in the following description is merely some embodiments of the disclosure, and other drawings can be obtained according to the accompanying drawing without a creative labor.

The FIGURE is a flow chart of a method for intelligent fault detection and location of a power distribution network according to an embodiment of the disclosure.

DETAILED DESCRIPTION OF EMBODIMENTS

Technical solutions of the embodiments of the disclosure will be described clearly and completely with reference to the accompanying drawing referred in the embodiments of the disclosure. It is apparent that the described embodiments are merely part of the embodiments of the disclosure, but not all of them. Based on the embodiments in the disclosure, all other embodiments obtained by ordinary technicians in the art without a creative labor also belong to the protection scope of the disclosure.

In order to make the above objectives, features and advantages of the disclosure to be more obvious and understandable, the disclosure will be further explained in detail with reference to the accompanying drawing and specific embodiments.

Referring to, an embodiment of the disclosure provides a method for intelligent fault detection and location of a power distribution network, which may include steps S1 to S4.

In step S1, a network topology of the power distribution network is constructed based on equipment components of the power distribution network.

For the network topology, there may be many structures. For example, the network topology may be an undirected graph, or, the network topology may be a tree network topology. In the disclosure, the network topology is the tree network topology, and a step of constructing the tree network topology may include following first and second steps.

In the first step, a component model of each of the equipment components is obtained. In particular, the equipment components of the power distribution network include buses, circuits (for example, cables), and switches. There are various topological relationships between the equipment components of the power distribution network, such as connection relationships between the circuits and the switches, connection relationships between the circuits, and the like. The component model should not only reflect natural attributes of the equipment components, but also express associations between the equipment components. In the embodiment, the component model may be expressed as follows.

$$Element=\{ID,Attribute,Relation\}$$

Specifically, ID indicates an identifier of an equipment component; Attribute indicates a management attribute of the equipment component, including at least one of an installation attribute, an operation attribute and an equipment parameter of the equipment component; and Relation indicates a network attribute of the equipment component, that is, an association between the equipment component and another equipment.

In the second step, the tree network topology of the power distribution network is constructed based on the component model. Specifically, an association matrix R is constructed based on the ID and the Relation of the component model, as shown in the following formula.

$$R=(E_1,E_2,\ldots,E_N)^T$$

In this formula, N indicates the number of the equipment components of the power distribution network; and $E_N$ indicates an association vector of the N-th equipment component of the equipment components. $E_j$ may be expressed as follows, where $j \in [1, N]$.

$$E_j=(ID_j,\text{Relation}_j), \text{Relation}_j=(ID_{j1},ID_{j2})$$

Specifically, $ID_j$ indicates an identifier and a network attribute of the j-th equipment component of the equipment components; and $\text{Relation}_j$ indicates an ID of each equipment component associated with the j-th equipment component. For example, if the j-th equipment component is associated with only one equipment component, $ID_{j2}$ is 0. Each equipment component of the power distribution network is a node in the tree network topology, therefore, the association matrix R is the tree network topology of the power distribution network.

In step S2, a voltage signal of each node of the network topology is obtained in real time, and the network topology is updated based on coherence of the voltage signals.

In this step, the voltage signal of each node in the network topology is collected according to a preset sampling frequency. The preset sampling frequency may be set according to an actual situation, for example, the preset sampling frequency may be set to be 15 minutes. Since frequent change-over operations of the switches in the power distribution network lead to a high frequency change-over of the network topology, therefore, in the disclosure, the change-over operations of the switches are detected through the coherence of the voltage signals, such that the operations of multiple switches simultaneously are detected and a detection result of the operations of the switches is obtained, and thus the network topology is updated based on the detection result.

In particular, the step of updating the network topology may include following first, second and third steps.

In the first step, a voltage signal sequence of each node of the network topology during a preset time period is obtained. Specifically, there are many methods for obtaining the voltage signal sequence during the preset time period, such as an equal-length sequence segmentation method and a sliding time window segmentation method. In the disclosure, the voltage signal obtained in real time is segmented based on an extreme point of the voltage signal of each node of the network topology, so as to obtain the voltage signal sequence of each node during the preset time period. Since the extreme point can reflect a local characteristic of the voltage signal sequence, an efficiency for detecting switching operations of each node can be effectively improved if the voltage signal sequence contains the extreme point.

In the second step, a Pearson correlation coefficient of the voltage signal sequences of every two adjacent nodes of the network topology is calculated based on each node of the tree network topology. The Pearson correlation coefficient indicates the coherence of the voltage signals of the two adjacent nodes.

In the third step, the network topology of the power distribution network is updated based on the Pearson correlation coefficient. If the Pearson correlation coefficient is greater than or equal to a preset threshold, which indicates that the two adjacent nodes are in an associated state, or otherwise, the two nodes are in an unassociated state. Therefore, $\text{Relation}_j$ is updated based on the Pearson correlation coefficient, so as to update the network topology.

In step S3, a current signal and a fault recorded signal of each node are obtained based on the updated network topology, a time-frequency conversion is performed on the current signal to obtain a time-frequency converted current signal, and a fault identification is performed on the power distribution network based on the time-frequency converted current signal to obtain a fault identification result of the power distribution network. If the fault identification result is that no fault is identified, steps S2 and S3 are repeated, otherwise, step S4 is implemented.

In this step, for solving a problem that a transmission power of the power distribution network is small, and a current signal thereof is easily affected by power fluctuation of distributed energy nodes, thereby causing a fault signal to be difficult to be distinguished, in the disclosure, a Fourier transform is adopted to perform the time-frequency conversion on the obtained current signal, for converting a time-frequency signal into a frequency-domain signal, and the fault identification is performed based on the frequency-domain signal.

There are many methods for the fault identification of the power distribution network based on the time-frequency converted current signal. For example, a following method may be adopted, specifically, a fault identification model is firstly constructed through a deep belief network, a parameter optimization is performed on the fault identification model according to historical current signals of each node to obtain a parameter-optimized fault identification model, and finally the time-frequency converted current signal is input into the parameter-optimized fault identification model to obtain (i.e., output) the fault identification result of the power distribution network.

Specifically, the deep belief network is formed by stacking several restricted Boltzmann machines from bottom to top. The restricted Boltzmann machine is a generative stochastic artificial neural network that can learn a probability distribution over its data set of inputs, and consists of a visible neuron layer and a hidden neuron layer. In the hidden neuron layer, neurons are not connected with each other, and each of the neurons is independent of a given training sample, thus making it easy to directly calculate an expected value dependent on data. In the visible neuron layer, neurons are not connected with each other. A Markova chain sampling process is performed on a hidden neuron state obtained from the training sample to estimate an expected value independent of data, and values of all of the neurons of the visible neuron layer and the hidden neuron layer are updated alternately in parallel.

In step S4, a fault locating is performed on the power distribution network through the updated network topology to determine a fault node, and a fault type of the power distribution network is identified based on a fault recorded signal of the fault node.

In this step, the fault locating of the power distribution network can be quickly and accurately performed based on the ID of the equipment component of the network topology.

With respect to a corresponding fault locating result for the fault locating, the fault recorded signal of the fault node is analyzed to obtain a fault type identification result. The fault recorded signal may record a whole changing process of a system current, a system voltage and derived quantities (such as active powers, reactive powers and system frequencies) thereof caused by a short-circuit fault, a system oscillation and a voltage collapse, for providing a data basis for the fault type identification. In the disclosure, the fault type of the power distribution network based on the fault recorded signal of the fault node may be identified through following steps: firstly, a fault type identification model is constructed based on a hierarchical support vector machine (H-SVM), secondly, a supervised training is performed on the fault type identification model based a historical fault recorded signal to obtain a trained fault type identification model, and finally, the fault recorded signal is inputted into the trained fault type identification model to obtain the fault type identification result of the power distribution network. It should be noted that, the fault type identification model constructed based on the H-SVM can identify various fault types.

In particular, the voltage signal, the current signal and the fault recorded signal of each node of the network topology may be collected by intelligent metering devices. For example, the voltage signal may be collected by a voltage quality online monitoring device, the current signal may be collected by an intelligent current transformer, and the fault recorded signal may be collected by an Intelligent fault recording and monitoring device.

The above embodiments merely describe preferred implements of the disclosure, but do not intend to limit the scope of the disclosure. Without departing from the design spirit of the disclosure, various modifications and improvements made by ordinary technicians in the art to the technical solutions of the disclosure shall fall within the protection scope determined by the claims of the disclosure.

What is claimed is:

1. A method for intelligent fault detection and fault location of a power distribution network, comprising:
    step S1, constructing a network topology of the power distribution network based on equipment components of the power distribution network;
    step S2, obtaining a voltage signal of each node of the network topology in real time, and updating the network topology based on coherence of the voltage signals to obtain an updated network topology;
    step S3, obtaining a current signal and a fault recorded signal of each node of the network topology from the updated network topology, performing a time-frequency conversion on the current signal to obtain a time-frequency converted current signal, performing a fault identification on the power distribution network based on the time-frequency converted current signal to obtain a fault identification result of the power distribution network; and repeating steps S2 and S3 in a situation that the fault identification result is that no fault is identified, or implementing step S4 in a situation that the fault identification result is that a fault is identified; and
    step S4, performing a fault locating on the power distribution network through the updated network topology to determine a fault node, and identifying a fault type of the power distribution network based on a fault recorded signal of the fault node.

2. The method for intelligent fault detection and fault location of the power distribution network according to claim 1, wherein the network topology is a tree network topology, and a step of constructing the tree network topology of the power distribution network comprises:
    obtaining a component model of each of the equipment components of the power distribution network; and
    constructing the tree network topology of the power distribution network based on the component model.

3. The method for intelligent fault detection and fault location of the power distribution network according to claim 2, wherein the component model is as follows:

Element={ID,Attribute,Relation} wherein ID indicates an identifier of an equipment component; Attribute indicates a management attribute of the equipment component; and Relation indicates a network attribute of the equipment component.

4. The method for intelligent fault detection and fault location of the power distribution network according to claim 3, wherein constructing the tree network topology of the power distribution network based on the component model, comprises:
    constructing an association matrix R based on the I/D and the Relation of the component model, wherein the association matrix R is as follows:

$R=(E_1, E_2, \ldots, E_N)^T$ wherein N indicates the number of the equipment components of the power distribution network; $E_N$ indicates an association vector of the N-th equipment component of the equipment components, and $E_j$ is as follows, wherein $j \in [1, N]$, $E_j=(ID_j, Relation_j), Relation_j=(ID_{j1}, ID_{j2})$, wherein $ID_j$ indicates an identifier and a network attribute of the j-th equipment component of the equipment components; $Relation_j$ indicates an ID of each equipment component associated with the j-th equipment component; $ID_{j1}$ and $ID_{j2}$ respectively indicate IDs of first and second equipment components associated with the j-th equipment component; and the association matrix R is the tree network topology of the power distribution network.

5. The method for intelligent fault detection and fault location of the power distribution network according to claim 3, wherein performing the fault locating on the power distribution network, comprises:
    performing the fault locating based on the ID of the equipment component of the network topology.

* * * * *